United States Patent [19]

Hayashi et al.

[11] Patent Number: 4,669,793

[45] Date of Patent: Jun. 2, 1987

[54] MATING TYPE ELECTRIC CONNECTOR BOX STRUCTURE

[75] Inventors: Hideharu Hayashi; Yoshiaki Ishikawa, both of Kosai, Japan

[73] Assignee: Yazaki Corporation, Tokyo, Japan

[21] Appl. No.: 824,084

[22] Filed: Jan. 30, 1986

[30] Foreign Application Priority Data

Feb. 5, 1985 [JP] Japan .................................. 60-19220

[51] Int. Cl.$^4$ ....................... H05K 7/10; H01R 13/625

[52] U.S. Cl. ....................................... 439/64; 439/338; 439/559

[58] Field of Search ................ 339/17 R, 17 C, 17 M, 339/17 F, 94 A, 88 R, 88 C, 126 R, 126 RS, 128, 132 R, 132 B, 147 R, 147 P, 193 P, 143 R, 14 R

[56] References Cited

U.S. PATENT DOCUMENTS 3,551,874 12/1970 Volinskie .......................... 339/17 C
3,865,454 2/1975 Blinder .............................. 339/17 C
4,390,219 6/1983 Beehler ............................. 339/14 R
4,431,251 2/1984 Krantz ............................ 339/143 R
4,585,284 4/1986 Koser et al. ...................... 339/14 R

FOREIGN PATENT DOCUMENTS 1665408 3/1971 Fed. Rep. of Germany ...... 339/128
55-44317 10/1980 Japan .
57-38457 8/1982 Japan .

OTHER PUBLICATIONS

IBM Bulletin, Larrabee, vol. 1, No. 5, p. 9, 2—1959.

*Primary Examiner*—Neil Abrams
*Attorney, Agent, or Firm*—Murray and Whisenhunt

[57] ABSTRACT

Disclosed herein is a mating type electric connector box structure comprising a pair of first and second electric connector box members arranged in opposed relation with each other with a partition board having a through-hole interposed therebetween, a plurality of conductor members provided on an opposed surface of said first electric connector box member, said conductor members being adapted to be electrically connected to a desired internal circuit incorporated therein, and a plurality of conductor receiving members provided on an opposed surface of said second electric connector box member, said conductor receiving members being adapted to be electrically connected to a desired internal circuit incorporated therein and being adapted to mate said conductor members, wherein when said first and second electric connector box members are fixed to said partition board, said conductor members are electrically connected with said conductor receiving members.

8 Claims, 7 Drawing Figures

MATING TYPE ELECTRIC CONNECTOR BOX STRUCTURE

BACKGROUND OF THE INVENTION

The present invention relates to a mating type electric connector box structure, and more particularly to an electric connector box structure suitable for making an electric wiring light-weight and simple at a partition board section, that is, a dash panel section which separates an engine room from a cabin in an automobile.

Electric connector box known in the field of the art includes a fuse box, a relay box or a connector box collectively incorporating desired electric circuits which are provided with connectors and terminals to be connected with electric parts such as various loads, switches and connectors at an external portion thereof.

As shown in FIG. 5, there has been proposed in Japanese Patent Publication No. 57-38457 that four connector boxes 1, 2, 3 and 4 are distributedly located at suitable positions in an engine room A and a cabin B for the purpose of simplifying an electric wiring system in the automobile.

In the aforementioned conventional system, the connector box 1 located in the engine room A and the connector boxes 2 and 4 located in the cabin B are separately arranged with a partition board (dash panel) C interposed therebetween. Accordingly, it is necessary to install grommets 5 as disclosed in Japanese Utility Model Publication No. 55-44317 for the purpose of preventing moisture, toxic gas and noise in the engine room A from entering the cabin B. Further, many wires and connectors must be used for connection between the connector box 1 and the connector boxes 2 and 4 to generate the following problems.

(1) In an assembling step of a combined electric wire (wiring harness) for the automobile, much labor and time are required for attachment of the grommets to result in installation inefficiency.

(2) As many connectors and wires are required for interconnection between the connector boxes, the weight and number of parts are increased to result in increase in the manufacturing cost of wire harnesses.

(3) The connector is generally of such a type that a male terminal 6 is inserted into a female terminal 7 as shown in FIG. 6, and a clearance at an insertion part 8 of the female terminal 7 is narrow for the purpose of enhancing a contact pressure between both the members 6 and 7. Thus, a direction of connection between the members 6 and 7 is so limited that with increase of terminals a large insertion or release force is required for engaging and disengaging the members 6 and 7, thus resulting in working inefficiency.

SUMMARY OF THE INVENTION

Accordingly, it is an object of the present invention to provide a mating type electric connector box structure which permits electric connection at a partition board (dash panel) section to be easily carried out without involving use of a grommet or many connectors and wires.

It is another object of the present invention to supply a wire harness having a light-weight and simple wiring mode at a reduced cost.

According to the present invention, there is provided a mating type electric connector box structure comprising first and second electrical connector boxes provided on both sides of a partition board, said partition board having an aperture therein, at least one of said first and second electrical connector boxes having means for mounting said at least one of the boxes on said partition board to close said aperture, said first and second electrical connector boxes having planar members opposing each other across said aperture, said planar members including first and second planar members; conductor members erected on said first planar member, said first planar member having electrical circuits arranged therein and connected to said conductor members; and conductor receiving members erected on said second planar member for receiving said conductor members, said second planar member having electrical circuits arranged therein and connected to said conductor receiving members, whereby said conductor members and said conductor receiving members are arranged to be brought into engagement with each other.

The invention will be more fully understood from the following detailed description and appended claims when taken with the drawings.

DETAILED DESCRIPTION OF THE PREFERRED EMBODIMENT

Figure 1:
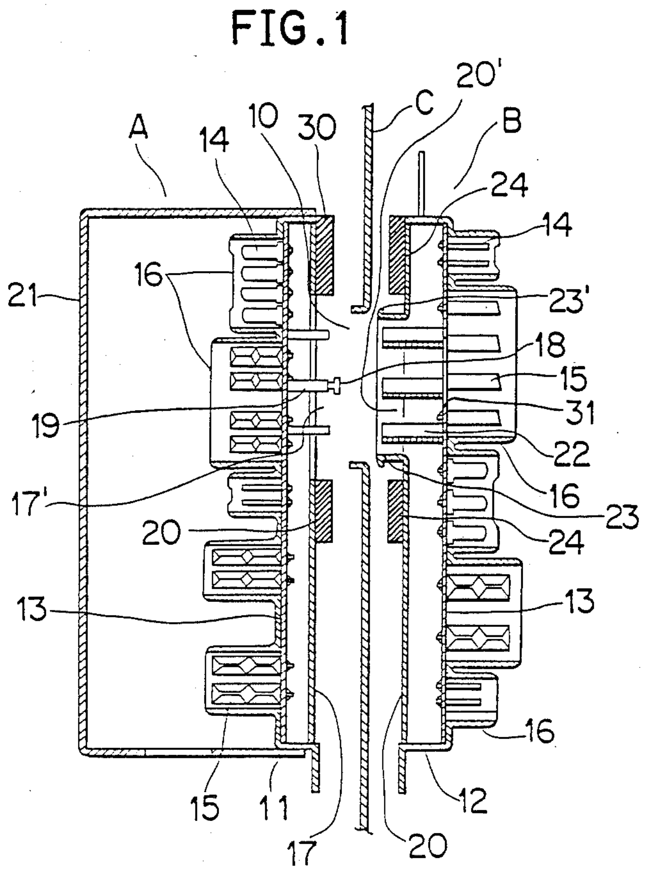
FIG. 1 is a sectional view of a mating type electric connector box structure in a separated condition of a preferred embodiment of the present invention.
Figure 3:
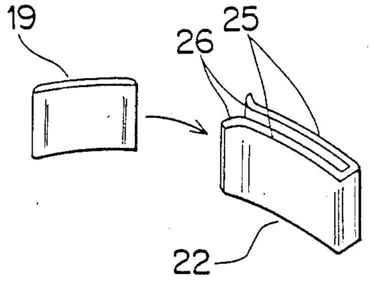
FIG. 3 is an enlarged perspective view of a conductor member and a conductor receiving member.

Referring to FIG. 1, an electric connector box 11 on an engine room A side is arranged in opposed relation with an electric connector box 12 on a cabin B side with a partition board or a dash panel C interposed therebetween. Said partition board C has a circular aperture 10 therein. The electric connector boxes 11 and 12 incorporate electric circuit boards 13 opposing each other across said aperture 10 of the partition board C. Said circuit board 13 has a desired circuit pattern such as a printed circuit board, a bus bar circuit board and a thick film substrate therein. On the outsides of the connector boxes 11 and 12, there are formed connector sections 16 having a plurality of male terminals 14 and female terminals 15 therein. Electronic parts such as an external connector and a relay unit are adapted to be engaged with the connector sections 16.

In facing relation to the partition board C, there is provided a bottom plate 17 of the electric connector box 11 on the engine room A side. Said bottom plate 17 has a circular opening 17' therein opposite the aperture 10 of the partition board C. A positioning pin 18 and a plurality of conductor member 19 are mounted on the circuit board 13 of the connector box 11 to extend through the opening 17' in the bottom plate 17. Said conductor members 19 are electrically connected to desired internal circuits of the electric circuit board 13. A waterproof packing 30 is provided on the bottom plate 17 in facing relation to the partition board C to surround the opening 17'. On the other side, a waterproof cover 21 is so provided as to cover the outside of the connector 11.

Figure 2A:
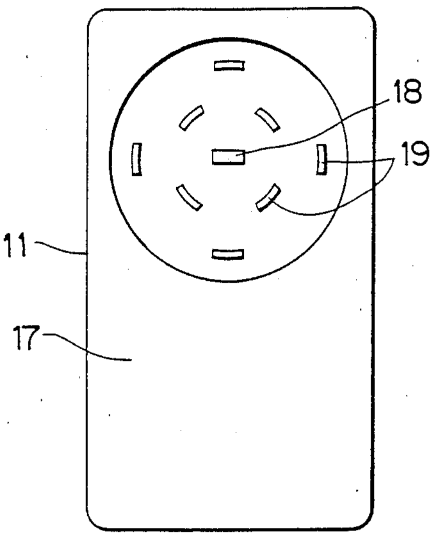
FIGS. 2(*a*) and 2(*b*) are bottom plan views of a pair of electric connector boxes used in the embodiment of FIG. 1.
Figure 2B:
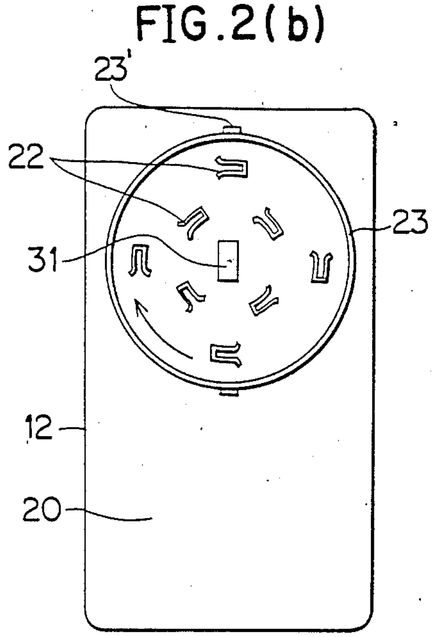
Figure 4:
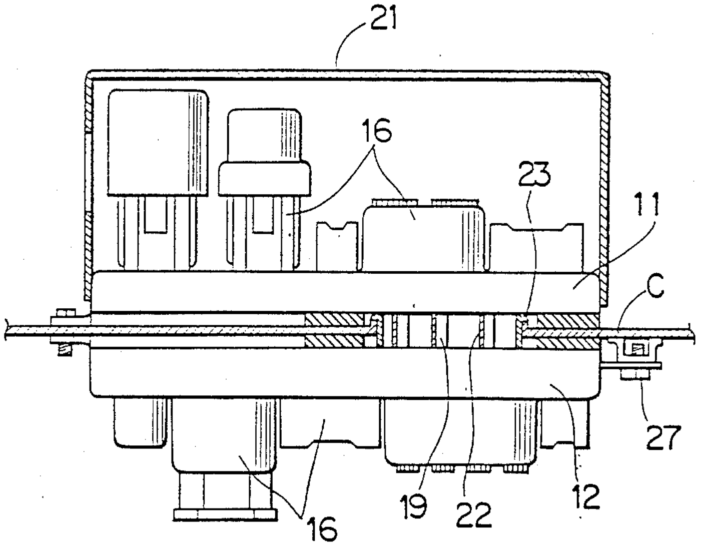
FIG. 4 is a sectional view of the electric connector box structure in a mated condition in the preferred embodiment.

As shown in FIGS. 2(*a*) and 3, the conductor members 19 are formed in a sectionally arcuate shape, and are arranged along concentric circles about the positioning pin 18.

On the other hand, a bottom plate 20 is provided in facing relation to the partition board C to the electric connector box 12 on the cabin B side. Said bottom plate 20 has a circular opening 20' therein opposite the aperture 10 of the partition board C. A positioning hole 31 and conductor receiving members 22 to mate the conductor members 19 are provided on the circuit board 13 of the connector box 12 to extend through the opening 20' in the bottom plate 20. Said conductor receiving members 22 are electrically connected to circuits of the circuit board 13 of the connector box 12. Said bottom plate 20 has an annular wall 23 erected from around the opening 20'. Said annular wall 23 has a size slightly smaller than the aperture 10 of the partition board C to provide a press fit thereinto. Said annular wall member 23 has a latch 23' attached thereto for locking the annular wall member 23 in the aperture 17'. Further, a movement preventing member 24 made of elastic materials such as rubber is attached to the bottom plate 20 in facing relation to the partition board C. As shown in FIGS. 2(*b*) and 3, each of the conductor receiving members 22 includes a generally channel shaped member having a pair of holding pieces 25 which are arc-shaped and concentrically arranged about the positioning hole 31. Each of the holding pieces 25 is formed at its gap end with insertion guide portions 26 divergently opened in the rotational directions along the afore-mentioned concentric circles.

A shape of the conductor members 19 mating the conductor receiving members 22 is not limited to be arcuate, but it may be of a pin-like shape. As a modified form, the conductor members 19 and the conductor receiving members 22 may be of a pin-jack type, and in this case, they may be arranged in zigzag, squares and any arbitrarily random forms other than in circles.

In the following, there will be described an assembling operation of the electric connector boxes opposed to each other.

First, the annular wall member 23 on the cabin B side is inserted into the hole 10 of the dash panel C to lock the electric connector box 12 by means of the latch 23' within the aperture 10. At this time, since the movement preventing member 24 is elastically compressed, the electric connector box 12 is brought into tight contact with the panel C thereby to prevent movement or play from being generated.

Secondly, the positioning pin 18 of the electric connector box 11 is inserted into the positioning hole 31 from the engine room A side. Then, when the conductor members 19 are rotated clockwise as viewed by an arrow in FIG. 2(*b*), they are forced into a spacing between the holding pieces 25 of the conductor receiving members 22 and are elastically held thereby. As a result, both the electric connector boxes 11 and 12 are electrically connected with each other.

Figure 5:
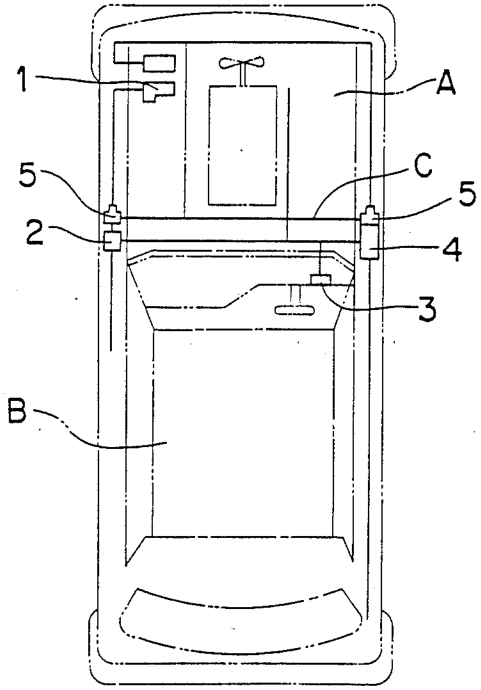
PRIOR ART FIG. 5
FIG. 5 is a wiring diagram of a wire harness for an automobile in the prior art.
Figure 6:
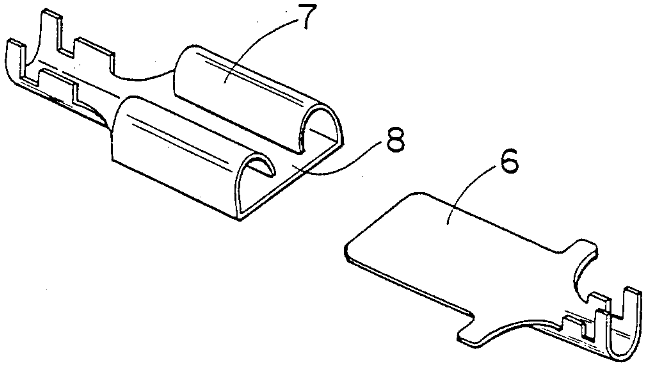
PRIOR ART FIG. 6
FIG. 6 is a perspective view of a male terminal and a female terminal in the prior art.

Finally, the electric connector box 11 is fixed by a screw 27 or the like as shown in FIG. 5, thus completing the assembling operation. At this time, the electric connector box 11 is also brought into elastically tight contact with the panel C by the waterproof packing 30 on the bottom plate 17 thereby to prevent movement or play from being generated. Further, since the hole 10 of the panel C is sealed double by both the electric connector boxes 11 and 12, it is possible to completely prevent moisture, toxic gas and noise in the engine room A from entering the cabin B.

As is described above, the electric connector boxes 11 and 12 may be very simply assembled in a one-touch manner without requiring plural connectors and electric wires for connection as in the prior art, and the need for troublesome mounting of the grommet may be eliminated.

Having thus described the preferred embodiment of the invention, it should be understood that numerous structural modifications and adaptations may be made without departing from the spirit of the invention.

What is claimed is:

1. A mating type electric connector box structure comprising first and second electrical connector boxes provided on opposite sides of a partition board, said partition board having an aperture therethrough, each of said first and second electrical connector boxes having a bottom plate in facing relation to said partition board, each of said respective bottom plates having an opening therethrough corresponding to and opposed to said aperture through said partition board, at least one of said first and second electrical connector boxes having means for mounting said at least one of said boxes on said partition board to close said aperture;

a first planar electric circuit board disposed within said first electrical connector box;

a second planar electric circuit board disposed within said second electrical connector box, said first and second planar electric circuit boards positioned on opposite sides of said respective bottom plates with respect to said partition board and opposing each other across said aperture;

conductor members erected on said first planar electric circuit board, said first planar electric circuit board having electrical circuits arranged therein and connected to said conductor members;

conductor receiving members erected on said second planar electric circuit board for receivingly electrically engaging said conductor members, said second planar electric circuit board having electrical circuits arranged therein and connected to said conductor receiving members, said conductor members and said conductor receiving members extending through said openings in said respective bottom plates;

a positioning pin, mounted on said first planar electric circuit board, and extending through said opening in said respective bottom plate;

a positioning hole, receivable of said positioning pin, formed in said second planar electric circuit board, whereby upon insertion of said positioning pin into said positioning hole said conductor members and said conductor receiving members are arranged to be brought into engagement with each other.

2. The mating type electric connector box structure according to claim 1, wherein said conductor members are arranged concentrically, on said first planar electric circuit board, about said positioning pin; said conductor receiving members being arranged concentrically on said second planar electric circuit board for engagement with said conductor members.

3. The mating type electric connector box structure according to claim 2, wherein each conductor receiving member includes a generally channel shaped member having a pair of arc-shaped holding pieces concentrically arranged about said positioning hole, said arc-shaped holding pieces defining a gap opening in a same direction as those of other conductor receiving members.

4. The mating type electric connector box structure according to claim 3, wherein said pair of holding pieces have diverging guide portions extending therefrom at said gap.

5. A mating type electric connector box structure comprising first and second electrical connector boxes provided on opposite sides of a partition board, said partition board having an aperture therethrough, each of said first and second electrical connector boxes having a bottom plate in facing relation to said partition board, each of said respective bottom plates having an opening therethrough corresponding to and opposed to said aperture through said partition board;

mounting means for mounting said first and second electrical connector boxes on opposite sides of said partition board with said openings in said respective bottom plates opposed to one another across said aperture;

first sealing means, disposed between the bottom plate of said first electrical connector box and said partition board, for surrounding said opening in said bottom plate of said first electrical connector box and forming a waterproof seal;

second sealing means, disposed between the bottom plate of said second electrical connector box and said partition board, for surrounding said opening in said bottom plate of said second electrical connector box and forming a waterproof seal;

a first planar electric circuit board disposed within said first electrical connector box;

a second planar electric circuit board disposed within said second electrical connector box, said first and second planar electric circuit boards positioned on opposite sides of said respective bottom plates with respect to said partition board and opposing each other across said aperture;

conductor members erected on said first planar electric circuit board, said first planar electric circuit board having electrical circuits arranged therein and connected to said conductor members;

conductor receiving members erected on said second planar electric circuit board for receivingly electrically engaging said conductor members, said second planar electric circuit board having electrical circuits arranged therein and connected to said conductor receiving members, said conductor members and said conductor receiving members extending through said openings in said respective bottom plates whereby said conductor members and said conductor receiving members are arranged to be brought into engagement with each other.

6. The mating type electric connector box structure according to claim 5, wherein said mounting means comprises a surrounding wall erected about the opening in one of said bottom plates and having a size slightly smaller than said aperture in said partition board to provide a press fit thereinto.

7. The mating type electric connector box structure according to claim 6, wherein said surrounding wall has latch means for locking said surrounding wall in said aperture.

8. The mating type electric connector box structure according to claim 6, wherein said opening in said bottom plate is circular, said surrounding wall comprises an annular wall member, and said aperture is circular.

* * * * *